(12) United States Patent
Erhardt et al.

(10) Patent No.: US 6,514,859 B1
(45) Date of Patent: Feb. 4, 2003

(54) METHOD OF SALICIDE FORMATION WITH A DOUBLE GATE SILICIDE

(75) Inventors: Jeff Erhardt, San Jose, CA (US); Eric Paton, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/733,843

(22) Filed: Dec. 8, 2000

(51) Int. Cl.[7] .............................................. H01L 21/44
(52) U.S. Cl. .................... 438/664; 438/592; 438/630; 438/649; 438/651; 438/652; 438/655; 438/660; 438/657; 438/682; 257/755; 257/757; 257/754
(58) Field of Search ................................ 438/283, 299, 438/592, 649, 651, 652, 655, 604, 682, 301, 303, 522, 523, 657, 658, 630, 660, 683, 685; 257/755, 757, 754

(56) References Cited

U.S. PATENT DOCUMENTS

| | | | | |
|---|---|---|---|---|
| 4,587,718 | A | 5/1986 | Haken et al. ................. | 29/571 |
| 4,877,755 | A | 10/1989 | Rodder ........................ | 438/655 |
| 5,322,809 | A | 6/1994 | Moslehi ....................... | 438/592 |
| 5,869,396 | A | * 2/1999 | Pan et al. .................... | 438/647 |
| 5,891,785 | A | 4/1999 | Chang ......................... | 438/305 |
| 5,908,314 | A | 6/1999 | Lin et al. ..................... | 438/301 |
| 6,136,705 | A | 10/2000 | Blair ........................... | 438/682 |
| 6,171,959 | B1 | 1/2001 | Nagabushnam ............. | 438/683 |
| 6,187,675 | B1 | * 2/2001 | Buynoski .................... | 438/655 |
| 6,194,258 | B1 | * 2/2001 | Wuu ........................... | 438/200 |
| 6,238,986 | B1 | 5/2001 | Kepler ........................ | 438/301 |
| 6,255,215 | B1 | * 7/2001 | Hause et al. ................. | 438/682 |
| 6,268,257 | B1 | * 7/2001 | Wieczorek et al. ......... | 438/305 |
| 6,306,698 | B1 | 10/2001 | Wieczorek et al. ......... | 438/197 |
| 6,319,784 | B1 | * 11/2001 | Yu et al. ..................... | 438/301 |
| 6,387,786 | B1 | 5/2002 | Erhardt et al. .............. | 438/586 |
| 6,399,467 | B1 | 6/2002 | Erhardt et al. .............. | 438/592 |

OTHER PUBLICATIONS

New Effect of Ti–Capping Lyer in Co Salicide Porcess Promising for Deep Sub–quarter Micron Technology, Ja–Hum Ku, Chul–Sung Kim, Chul–Joon Choi, Kazuyuki Fujihara, Ho–Kyu Kang, Moon–Yong Lee, Ju–Hyuck Chung, Eung–Joon Lee, Jang–Eun Lee, Dae–Hong Ko; Process Development, Team, Semiconductor R&D Division, Samsung Electronics San #24, Nongseo–Ri, Kiheyng–Eup, Yongin–City, Kyungki–Do, 449–900, Korea.
The Influence of Capping Layer Type on Cobalt Salicide Formation in Films and Narrow Lines, P.R. Besser, A. Lauwers, N. Roelandts, K. Maex, W. Blum, R. Alvis, Stucchi, M. De Potter, Advanced Interconnect Process Development, Advanced Interconnects and Contact Materials and Processes for Future Ics.
"Manufacturability Issues related to Transient Thermal Annealing of Titanium Silicide Films in a Rapid Thermal Processor" Shenai, K. IEEE Transactions on Semiconductor Manufacturing. vol. 4, No. 1, Feb., 1991, pp. 1–8.
"Correlation of Film Thickness and Deposition Temperature with PAI and the Scalability of Ti–Salicide Technology to Sub–0.18 Tm Regime" Ho, C; Karunasiri, S.; Chua, S.; Pey, K.; Siah, S.; Lee, K.; Chan, L., Interconnect Tech, Conference, 1998, pp. 193–195.
"A Model for Titanium Silicide Film Growth" Borucki, L.; Mann, R.; Miles, G.; Slinkman, J.; Sullivan, T.; Electron Devices Meeting, 1998, Technical Digest, Intl. 1998, pp. 348–351.

* cited by examiner

Primary Examiner—Long Pham
Assistant Examiner—Hsien Ming Lee
(74) Attorney, Agent, or Firm—Skjerven Morrill LLP

(57) ABSTRACT

A method of forming a self-aligned silicide (salicide) with a double gate silicide. The method improves transistor speed by lowering the leakage current in the source and drain areas and lowering the polysilicon sheet resistance of the gate. As a result of one embodiment of the present method, a silicide is formed over the gate area which is advantageously thicker than silicide formations over the source and drain areas.

24 Claims, 2 Drawing Sheets ated to a method of forming a silicide. In particular, the present invention relates to a method of forming a salicide with a double gate silicide.

METHOD OF SALICIDE FORMATION WITH A DOUBLE GATE SILICIDE

BACKGROUND OF THE INVENTION

1 Field of the Invention

This present invention relates to a method of forming a salicide. In particular, the present invention relates to a method of forming a salicide with a double gate silicide.

2 Description of Related Art

A conventional transistor comprises a source area, a drain area and a gate area between the source and drain areas.

SUMMARY

The present invention relates to a method of forming a self-aligned silicide (salicide) with a double gate silicide. The method improves transistor speed by lowering the leakage current in the source and drain areas and lowering the polysilicon sheet resistance of the gate. As a result of one embodiment of the present method, a silicide is formed over the gate area which is advantageously thicker than silicide formations over the source and drain areas. The silicide formations formed over the source and drain areas are advantageously shallow, such that the silicide formations do not impede the junction and cause current leakage.

One aspect of the invention relates to a method of forming a silicide. The method comprises forming a barrier dielectric layer over a gate area, a source area and a drain area. A portion of the barrier dielectric layer is removed to expose at least the top of the gate area. A first metal layer is formed over the gate area and the barrier dielectric layer. A first thermal anneal is applied that causes the first metal layer to at least partially react with the gate area to form a first silicide layer over the gate area. Any unreacted metal from the first metal layer is removed. The barrier dielectric layer over the source and drain areas is removed. A second metal layer is formed over the first silicide layer and the source and drain areas. A second thermal anneal is applied, wherein the second thermal anneal causes (1) the second metal layer to react with the gate area to enhance the first silicide layer, and (2) the second metal layer to at least partially react with the source and drain areas to form second and third silicide layers. Any unreacted metal from the second metal layer is removed.

Another aspect of the invention relates to a product made by the method above.

The present invention will be more fully understood upon consideration of the detailed description below, taken together with the accompanying drawings.

DETAILED DESCRIPTION

Figure 1:
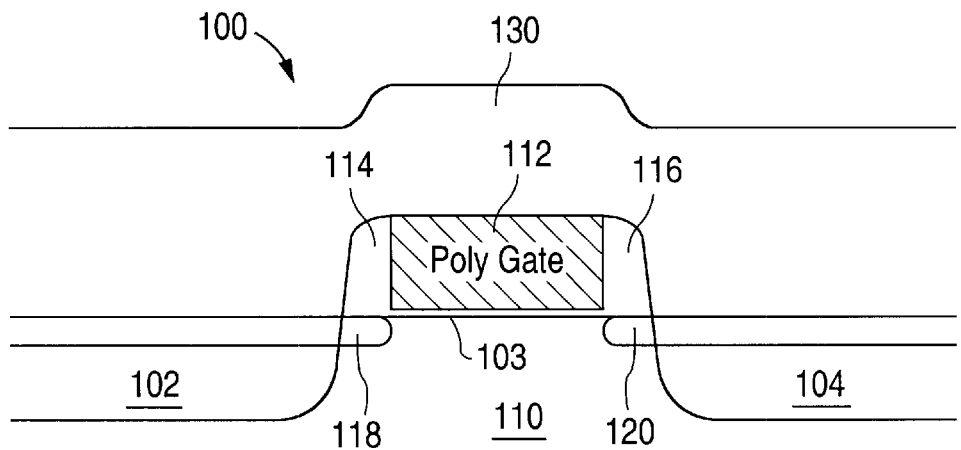
FIG. 1 illustrates one embodiment of a device at a first phase of development.

FIG. 1 illustrates one embodiment of a device 100 at a first phase of development. The device 100 comprises a substrate 110, a source area 102, a drain area 104, a gate dielectric layer 103, a gate area 112, first spacer 114, a second spacer 116, a first lightly-doped area (lightly-doped drain or LDD) 118, a second lightly-doped area 120, and a barrier dielectric layer 130.

In one embodiment, the gate area 112 includes a polysilicon, and the gate dielectric layer 103 includes an oxide. In one embodiment, the barrier dielectric layer 130 comprises an oxide or a self-planarizing material, such as Spin-On glass or a material provided using another self-planarizing vapor deposition. The spacers 114, 116 may comprise an oxide or a nitride, such as a silicon nitride. In one embodiment, the substrate 110 is doped with P-type dopants, while the source and drain areas 102, 104 are doped with N-type dopants. The substrate 110 may be doped with N-type dopants, while the source and drain areas 102, 104 are doped with P-type dopants.

In one embodiment, the device 100 of FIG. 1 is fabricated by conventional processing. The gate dielectric layer 103 is formed on the substrate 110, and a polysilicon layer is deposited on top of the gate dielectric layer 103. A diffusion barrier or hard mask layer (not shown) is then formed or deposited on top of the polysilicon layer. The gate area 112 is then etched from the polysilicon layer, but the etch stops on the gate oxide dielectric layer 103. The gate dielectric layer 103 is etched, and a first ion implantation step implants ions into source and drain areas 102, 104 to form the lightly-doped areas 118, 120.

A spacer layer is then deposited, and spacers 114, 116 are etched. The spacer etch is carried out under a high etch selectivity of the spacer material to the hard mask layer covering the gate area 112. The spacer etch stops on the silicon over the source and drain areas 102, 104 and the hard mask layer on the gate. The barrier dielectric layer 130 is formed over the gate area 112 and the source and drain areas 102, 104.

Figure 2:
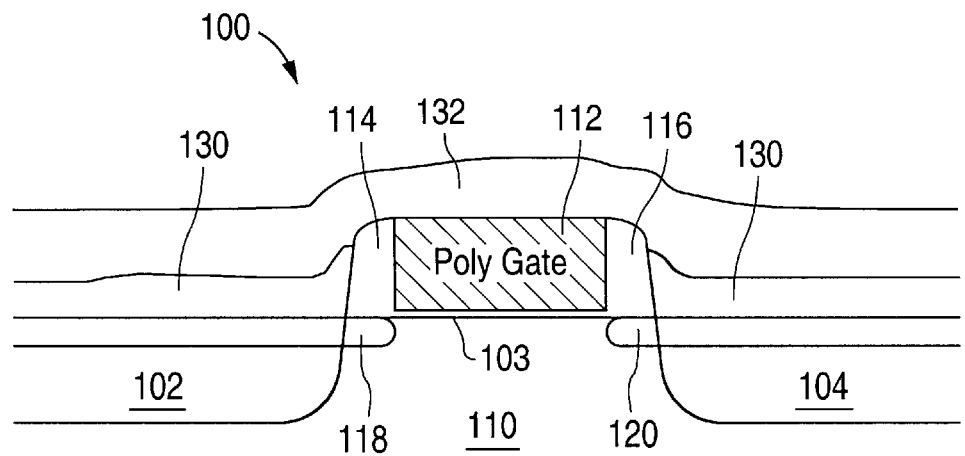
FIG. 2 illustrates the device of FIG. 1 at a second phase of development.

FIG. 2 illustrates the device 100 of FIG. 1 at a second phase of development. The barrier dielectric layer 130 is etched to expose the top of the gate area 12 and the spacers 114,116. A first metal layer 132 is deposited on the gate area 112, the spacers 114,116 and the barrier dielectric layer 130 by using a deposition process such as, for example, physical vapor deposition (PVD), chemical vapor deposition, directional metal deposition or some other suitable process. For example, a directional metal deposition process may be selected from a group of deposition process consisting of collimated, long throw and ionizing plasamas. To advantageously achieve a low polysilicon line/sheet resistance of the gate area 112, the first metal layer 132 is deposited onto the exposed polysilicon gate area 112 and over the barrier dielectric layer 130.

The first metal layer 132 may comprise a rare earth or transition metal from Groups 3B–8B and Groups 1B and 2B. For example, the first metal layer 132 may comprise Co, Ti, W, Ni or Mo.

Figure 3:
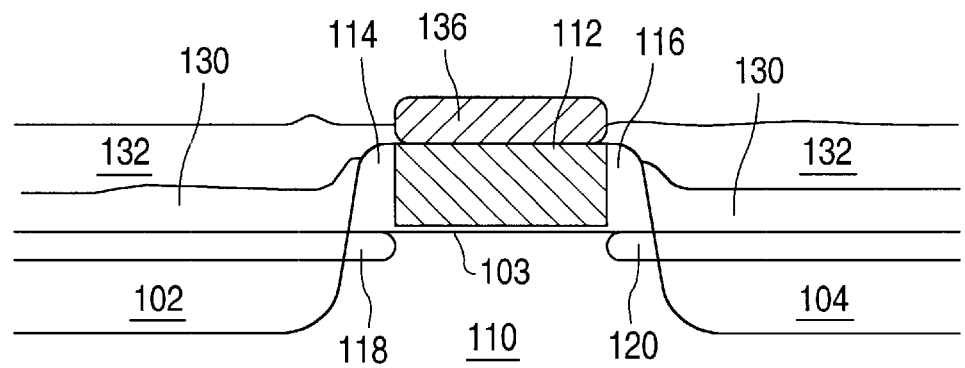
FIG. 3 illustrates the device of FIG. 1 at a third phase of development.

FIG. 3 illustrates the device 100 of FIG. 1 at a third phase of development. A thermal anneal (also called a reactive thermal anneal) causes the first metal layer 132 to react with the gate area 112 to form a silicide layer 136 on top of the gate area 112, as shown in FIG. 3. The thermal anneal may range in temperature, for example, from about 300 degrees C. to about 600 degrees C. The anneal may use a traditional furnace, rapid thermal anneal (RTA) such as lamp-heated or laser anneal.

In one embodiment, the silicide reaction in FIG. 3 is driven to substantial completion, e.g., about 100% of the first metal layer 132 over the gate area 112 is consumed by reacting with the gate area 112, while the first metal layer 132 over the other active areas (i.e., source and drain areas 102, 104) remains substantially unreacted. The barrier dielectric layer 130 advantageously slows down or prevents the source and drain areas 102, 104 from reacting with the metal layer 132.

Figure 4:
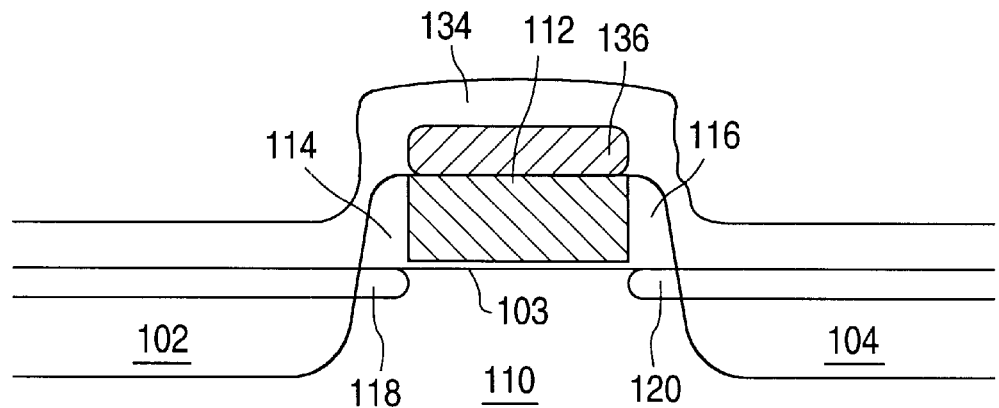
FIG. 4 illustrates the device of FIG. 1 at a fourth phase of development.

FIG. 4 illustrates the device 100 of FIG. 1 at a fourth phase of development. Any unreacted metal from the first metal layer 132 over the barrier dielectric layer 130 is removed, for example with a wet or selective chemical dry strip. A number of processes may be used to strip unreacted portions of the first metal layer 132, such as for example, by using ammonium peroxide, hydrogen peroxide, sulphuric acid, etc. The barrier dielectric layer 130 is etched to expose the silicon of the source and drain areas 102, 104. A second metal layer 134 is deposited. The second metal layer 134 is substantially similar to the first metal layer 132. The second metal layer 134 is preferably in direct contact with the bare silicon of the source and drain areas 102, 104.

Figure 5:
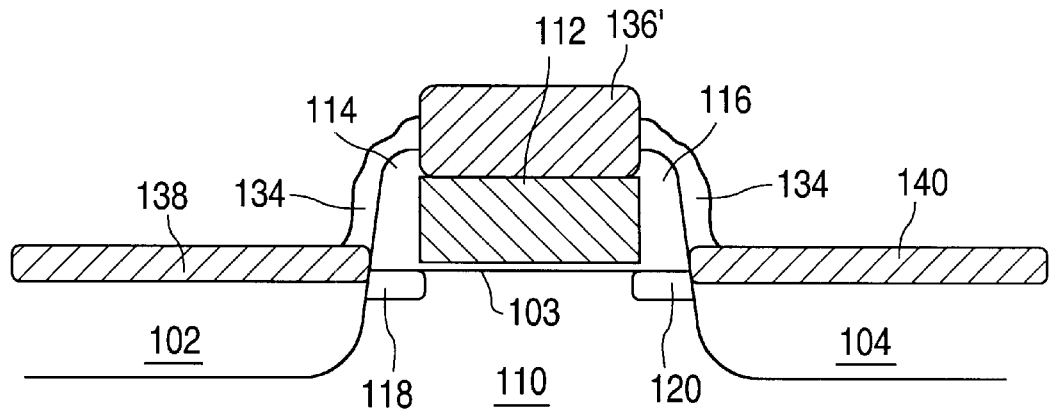
FIG. 5 illustrates the device of FIG. 1 at a fifth phase of development.

FIG. 5 illustrates the device 100 of FIG. 1 at a fifth phase of development. In FIG. 5, a second thermal anneal is performed. The second anneal may range in temperature, for example, from about 300 degrees C. to about 600 degrees C. The anneal may use a traditional furnace, rapid thermal anneal (RTA) such as lamp-heated or laser anneal. This second anneal advantageously causes the second metal layer 134 to react (1) with the gate area 112 to form an enhanced first silicide layer 136' and (2) with the source and drain areas 102, 104 to form second and third silicide layers 138, 140. In one embodiment, the silicide reaction in FIG. 5 is driven to substantial completion, e.g. about 100% of the second metal layer 134 over the gate area 112 is consumed by reacting with the gate area 112.

Figure 6:
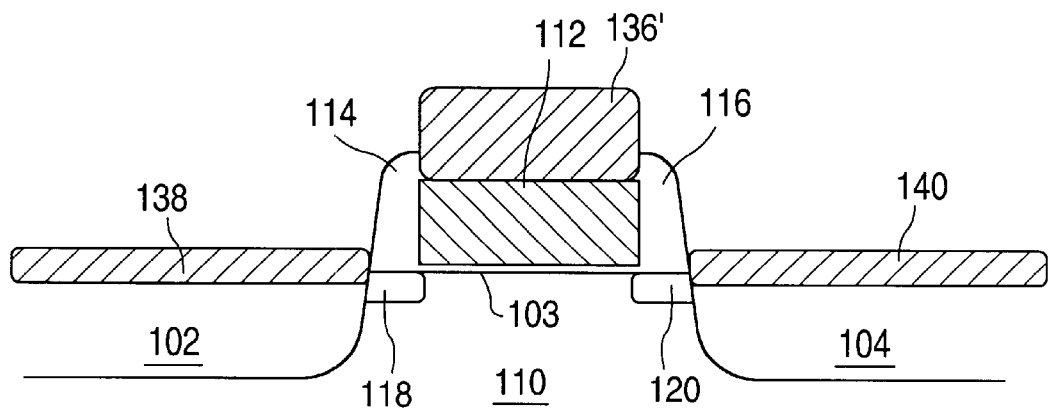
FIG. 6 illustrates the device of FIG. 1 at a sixth phase of development.

FIG. 6 illustrates the device 100 of FIG. 1 at a sixth phase of development. Unreacted portions of the second metal layer 134 are etched or stripped away. A number of processes may be used to strip the unreacted metal layer 134, such as for example, by using ammonium peroxide, hydrogen peroxide, sulphuric acid, etc.

The enlarged first silicide 136' over the gate area 112 is advantageously thicker than the second and third silicide layers 138, 140 over the source and drain areas 102, 104. In one embodiment, the resulting silicide formation 136' is about 2 to 3 times thicker than the silicide layers 138, 140 formed over the source and drain areas 102, 104. The desired thicknesses of the silicide layers 136', 138, 140 may be controlled by controlling the thickness of the deposited metal layers 132, 134 and/or the temperature of the thermal anneals.

The method described above improves transistor speed by lowering the leakage current in the source and drain areas 102, 104 and lowering the polysilicon sheet resistance of the gate area 112.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

What is claimed is:

1. A method of forming a silicide, the method comprising:
   forming a barrier dielectric layer over a gate area, a source area and a drain area;
   removing a portion of the barrier dielectric layer to expose at least the top of the gate area;
   forming a first metal layer over the gate area and the barrier dielectric layer;
   applying a first thermal anneal that causes the first metal layer to at least partially react with the gate area to form a first silicide layer over the gate area;
   removing any unreacted metal from the first metal layer;
   removing the barrier dielectric layer over the source and drain areas;
   forming a second metal layer over the first silicide layer and the source and drain areas;
   applying a second thermal anneal, wherein the second thermal anneal causes the second metal layer to react with the gate area to enhance the first silicide layer, and the second metal layer to at least partially react with the source and drain areas to form second and third silicide layers; and
   removing any unreacted metal from the second metal layer.

2. The method of claim 1, wherein the barrier dielectric layer comprises a self-planarizing material.

3. The method of claim 1, wherein the barrier dielectric layer comprises Spin-On glass.

4. The method of claim 1, wherein the first thermal anneal causes substantially all of the first metal layer over the gate area to react with the gate area, while the first metal layer over the barrier dielectric layer remains substantially unreacted.

5. The method of claim 1, wherein the second thermal anneal causes substantially all of the second metal layer over source and drain areas to react with the source and drain areas.

6. The method of claim 1, wherein the act of forming a first metal layer comprises a directional metal deposition.

7. The method of claim 6, wherein the directional metal deposition comprises a process selected from a group consisting of collimated, long throw and ionizing plasmas.

8. The method of claim 1, wherein the first anneal comprises a process selected from a group consisting of traditional furnace annealing, rapid lamp heated annealing and rapid laser annealing.

9. The method of claim 1, wherein the second anneal comprises a process selected from a group consisting of traditional furnace annealing, rapid lamp-heated annealing and rapid laser annealing.

10. The method of claim 1, further comprising depositing and etching a first spacer on a first side of the gate area and a second spacer on a second side of the gate area.

11. The method of claim 1, further comprising forming a first lightly-doped area on a first side of the gate area and a second lightly-doped area on a second side of the gate area.

12. The method of claim 1, further comprising forming the source and drain areas by doping a substrate.

13. The method of claim 1, wherein the first silicide layer is about two to about three times thicker than the second and third silicide layers.

14. The method of claim 1, wherein the second thermal anneal causes substantially all of the second metal layer over the gate area to react with the gate area.

15. The method of claim 1, wherein the first metal layer is selected from the group consisting of Co, Ti, W, Ni and Mo.

16. The method of claim 1, wherein the first thermal anneal ranges in temperature from about 300 degrees C. to about 600 degrees C.

17. The method of claim 1, wherein the second thermal anneal ranges in temperature from about 300 degrees C. to about 600 degrees C.

18. The method of claim 1, wherein the first thermal anneal causes about 50% to about 90% of the first metal layer over the gate area to react with the gate area, while the first metal layer over the barrier dielectric layer remains substantially unreacted.

19. The method of claim 1, further comprising controlling a thickness of the first silicide layer over the gate area by controlling thicknesses of the first and second metal layers.

20. The method of claim 1, further comprising controlling a thickness of the first silicide layer over the gate area by controlling a temperature of the first and second thermal anneals.

21. The method of claim 1, further comprising controlling a thickness of the second and third silicide layers by controlling a thickness of the second metal layer.

22. The method of claim 1, further comprising controlling a thickness of the second and third silicide layers by controlling a temperature of the second thermal anneal.

23. The method of claim 1, further comprising the acts of:

forming the gate dielectric layer on a substrate;

depositing a gate layer over the gate dielectric layer;

forming a mask layer over the gate layer; and etching the gate layer to form the gate area.

24. The method of claim 1, wherein removing the barrier dielectric layer over the source and drain areas occurs after forming the first metal layer.

\* \* \* \* \*